US008872235B2

(12) United States Patent
Prechtl et al.

(10) Patent No.: US 8,872,235 B2
(45) Date of Patent: Oct. 28, 2014

(54) INTEGRATED SCHOTTKY DIODE FOR HEMTS

(75) Inventors: Gerhard Prechtl, St. Jakob i. Rosenal (AT); Clemens Ostermaier, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/403,606

(22) Filed: Feb. 23, 2012

(65) Prior Publication Data

US 2013/0221363 A1      Aug. 29, 2013

(51) Int. Cl.
*H01L 29/66*      (2006.01)

(52) U.S. Cl.
USPC ...... 257/195; 257/76; 257/280; 257/E27.012; 438/167; 438/570

(58) Field of Classification Search
USPC .............. 257/76, 77, 194, 195, 280, E27.012; 438/167, 570
See application file for complete search history.

(56) References Cited

U.S. PATENT DOCUMENTS

| | | | | |
|---|---|---|---|---|
| 4,845,387 | A * | 7/1989 | Ovens | 326/126 |
| 6,362,495 | B1 * | 3/2002 | Schoen et al. | 257/77 |
| 7,838,907 | B2 * | 11/2010 | Shiraishi | 257/195 |
| 2002/0106587 | A1 * | 8/2002 | Lukanc et al. | 430/312 |
| 2006/0091430 | A1 * | 5/2006 | Sriram et al. | 257/280 |
| 2009/0050939 | A1 * | 2/2009 | Briere | 257/201 |
| 2011/0210337 | A1 * | 9/2011 | Briere | 257/76 |

OTHER PUBLICATIONS

Souza P, Swart J and Diniz J, Microelectronics technology and devices, 2003, Electrochemical Society, Sep. 2003, p. 166-172.*
Prechtl, Gerhard. "Integrated Heterojunction Semiconductor Device and Method for Producing an Integrated Heterojunction Semiconductor Device." U.S. Appl. No. 13/338,565, filed Dec. 28, 2011.
Curatola, Gilberto. "HEMT with Integrated Low Forward Bias Diode." U.S. Appl. No. 13/213,351, filed Aug. 19, 2011.

* cited by examiner

*Primary Examiner* — Allen Parker
*Assistant Examiner* — Gardner W Swan
(74) *Attorney, Agent, or Firm* — Murphy, Bilak & Homiller, PLLC

(57) ABSTRACT

An embodiment of a transistor device includes a compound semiconductor material on a semiconductor carrier and a source region and a drain region spaced apart from each other in the compound semiconductor material with a channel region interposed between the source and drain regions. A Schottky diode is integrated with the semiconductor carrier, and contacts extend from the source and drain regions through the compound semiconductor material. The contacts are in electrical contact with the Schottky diode so that the Schottky diode is connected in parallel between the source and drain regions. In another embodiment, the integrated Schottky diode is formed by a region of doped amorphous silicon or doped polycrystalline silicon disposed in a trench structure on the drain side of the device.

16 Claims, 14 Drawing Sheets

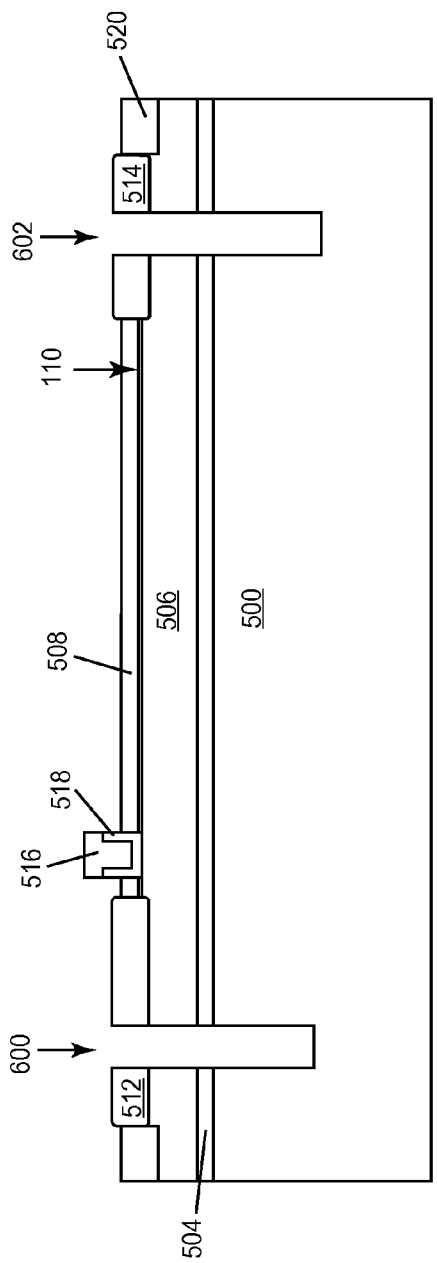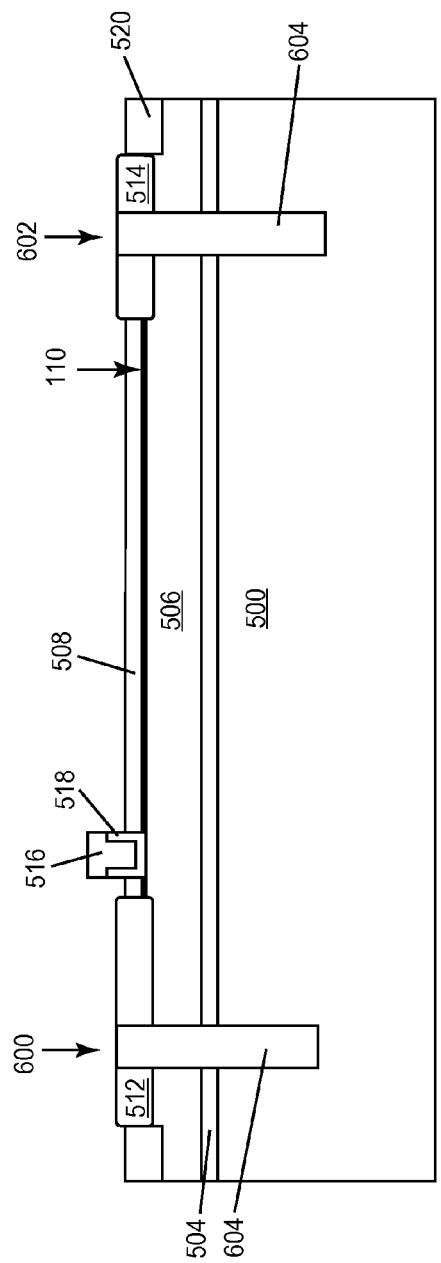

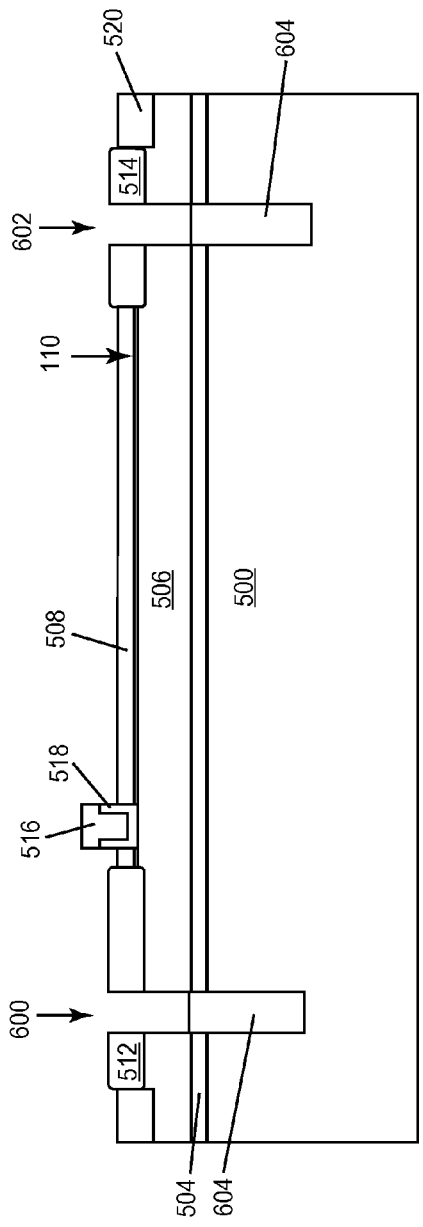
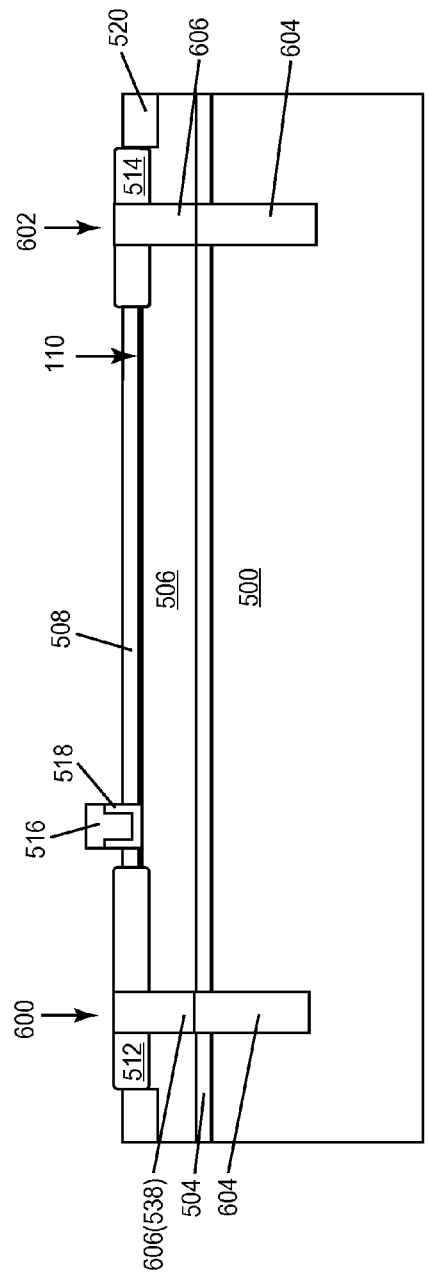

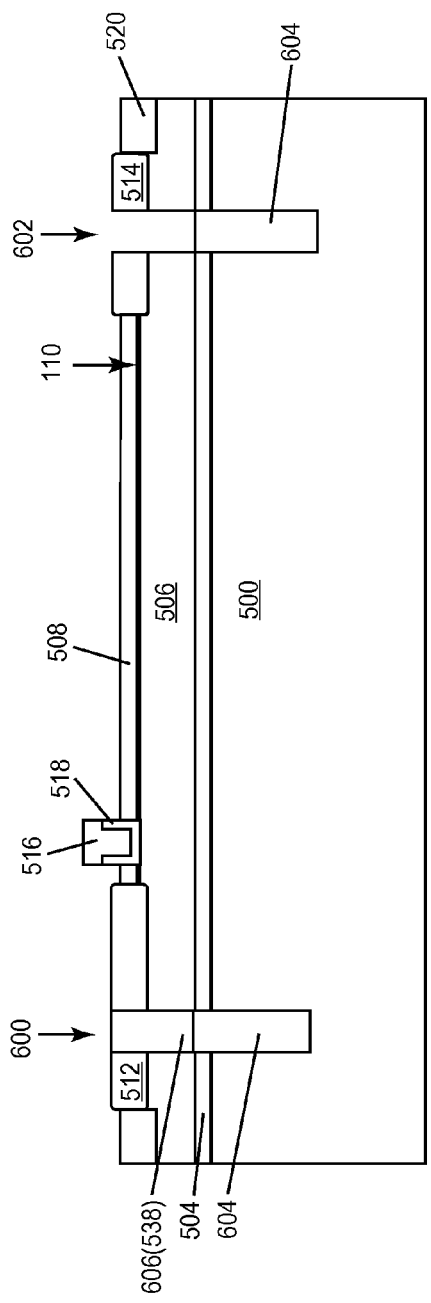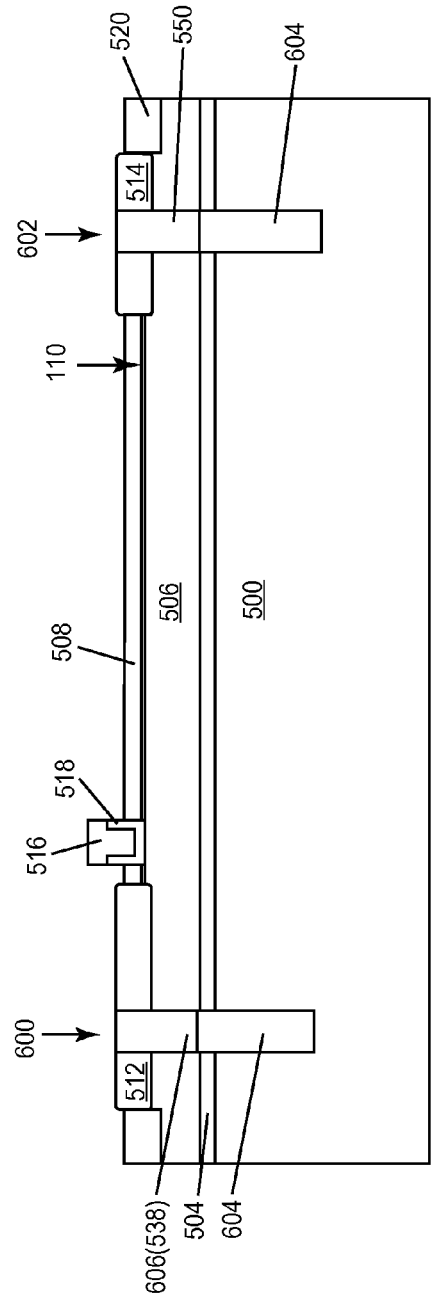

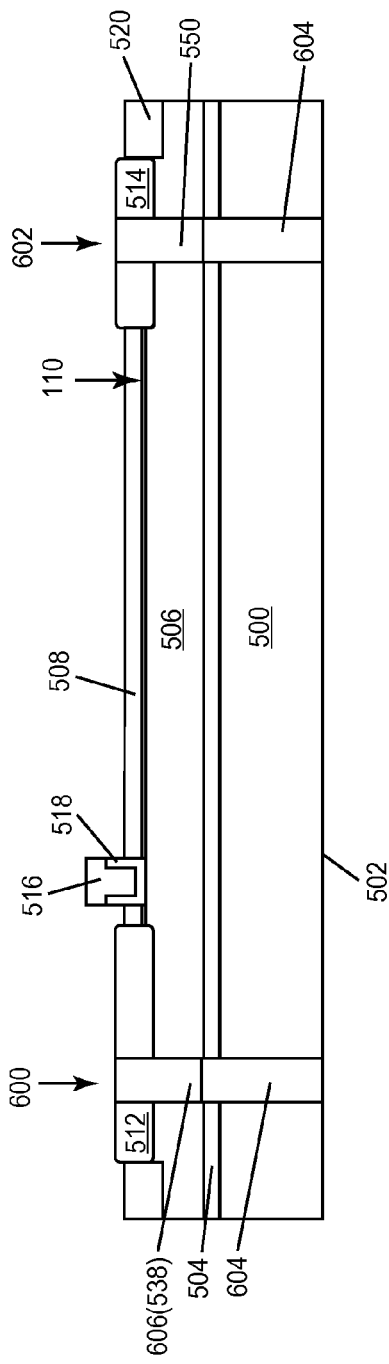
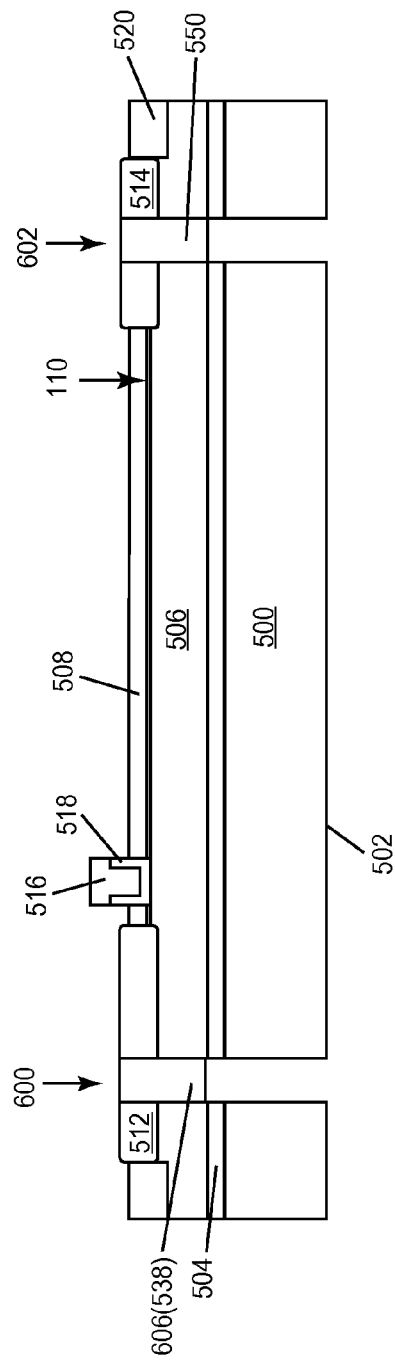

INTEGRATED SCHOTTKY DIODE FOR HEMTS

FIELD OF TECHNOLOGY

The present application relates to III-V semiconductor devices, in particular integrated Schottky diodes for III-V semiconductor devices.

BACKGROUND

AlGaN/GaN heterostructure devices have small capacitances during device switching, which originate partially from high electron mobility and because only majority carriers (e.g. electrons) are responsible for the on and off switching of the device. Any additional parts of the device such as a body diode ideally should not interfere with these material and device characteristics. Furthermore, the threshold voltage of a body diode leads directly to losses which are especially important for low voltage devices. Therefore Schottky diodes are typically preferred to be used as body diodes for low voltage devices because Schottky diodes have a generally lower threshold voltage compared to semiconductor diodes. Other conventional solutions to achieve low threshold voltage are the implementation of an additional MOS-gated diode (MGD), or an additional quasi-body diode buried in the bulk below the device. However, the MGD approach requires about 15% additional space and may further require an additional gate stack process in order to adjust the threshold voltage of the MGD gate close to about 0 V, which is typically not the same threshold voltage needed in power applications. A quasi-body diode buried in the bulk below an AlGaN/GaN heterostructure device can limit the breakdown voltage of the device.

SUMMARY

Disclosed herein is a Schottky diode integrated into a semiconductor carrier on which a III-V semiconductor device is fabricated, or alternatively formed from a region of doped amorphous silicon or doped polycrystalline silicon disposed in a trench structure of a III-V semiconductor device. The embodiments described herein occupy no or little additional area, and yield a diode which can achieve a low threshold voltage of less than 0.7 V e.g. 0.3V to 0.4V. The entire backside of the carrier can be used for the diode in some embodiments, and any additional resistance in reverse mode does not limit the advantages of III-V semiconductor devices.

According to an embodiment of a transistor device, the device includes a compound semiconductor material on a semiconductor carrier and a source region and a drain region spaced apart from each other in the compound semiconductor material with a channel region interposed between the source and drain regions. A Schottky diode is integrated with the semiconductor carrier, and contacts extend from the source and drain regions through the compound semiconductor material. The contacts are in electrical contact with the Schottky diode so that the Schottky diode is connected in parallel between the source and drain regions.

According to an embodiment of a method of manufacturing a transistor device, the method includes: forming a compound semiconductor material on a semiconductor carrier; forming a source region and a drain region spaced apart from each other in the compound semiconductor material with a channel region interposed between the source and drain regions; forming a Schottky diode integrated with the semiconductor carrier; and forming contacts extending from the source and drain regions through the compound semiconductor material and in electrical contact with the Schottky diode so that the Schottky diode is connected in parallel between the source and drain regions.

According to another embodiment of a transistor device, the device includes a compound semiconductor material on a carrier and a source region and a drain region spaced apart from each other in the compound semiconductor material with a channel region interposed between the source and drain regions. A doped amorphous silicon or doped polycrystalline silicon region contacts the drain region and extends through at least part of the compound semiconductor material. A metallization on a side of the carrier facing away from the compound semiconductor material extends to the doped amorphous silicon or doped polycrystalline silicon region to form a Schottky diode. A source contact extends from the source region through at least part of the compound semiconductor material and in electrical contact with the metallization so that the Schottky diode is connected in parallel between the source and drain regions.

According to another embodiment of a method of manufacturing a transistor device, the method includes: forming a compound semiconductor material on a carrier; forming a source region and a drain region spaced apart from each other in the compound semiconductor material with a channel region interposed between the source and drain regions; forming a doped amorphous silicon or doped polycrystalline silicon region in contact with the drain region and extending through at least part of the compound semiconductor material; forming a metallization on a side of the carrier facing away from the compound semiconductor material, the metallization extending to the doped amorphous silicon or doped polycrystalline silicon region to form a Schottky diode; and forming a source contact extending from the source region through at least part of the compound semiconductor material and in electrical contact with the metallization so that the Schottky diode is connected in parallel between the source and drain regions.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 7A to 7I illustrate perspective cross-sectional views of an embodiment of a method of manufacturing the semiconductor device shown in FIG. 6.

DETAILED DESCRIPTION

Embodiments described herein relate to integrated Schottky diodes for III-V semiconductor devices such as AlGaN/GaN heterostructure devices. The terms III-V semiconductor device, HEMT (high electron mobility transistor), MESFET (metal semiconductor field effect transistor), HFET (heterostructure FET) and MODFET (modulation-doped FET) are used interchangeably herein to refer to a field effect transistor device incorporating a junction between two materials with different band gaps (i.e. a heterojunction) as the channel. For example, GaAs may be combined with AlGaAs, GaN may be combined with AlGaN, InGaAs may be combined with InAlAs, GaN may be combined with InGaN, etc. In each case, a two-dimensional electron gas (2DEG) for an n-channel transistor or a two-dimensional hole gas (2DHG) for a p-channel transistor forms the conductive channel of the device. For ease of explanation and illustration only, the embodiments disclosed herein are explained in the context of an AlGaN/GaN HEMT. However, these embodiments equally apply to other HEMTs having different material combinations. In each case, the Schottky diodes described herein can be integrated into a semiconductor substrate on which a III-V semiconductor device is fabricated, or formed by a region of doped amorphous silicon or doped polycrystalline silicon disposed in a trench structure of the III-V device to provide a low forward voltage diode. In still other embodiments, the Schottky diode can be integrated as part of a bulk III-V transistor e.g. as described later herein with reference to FIG. 8.

Figure 1:
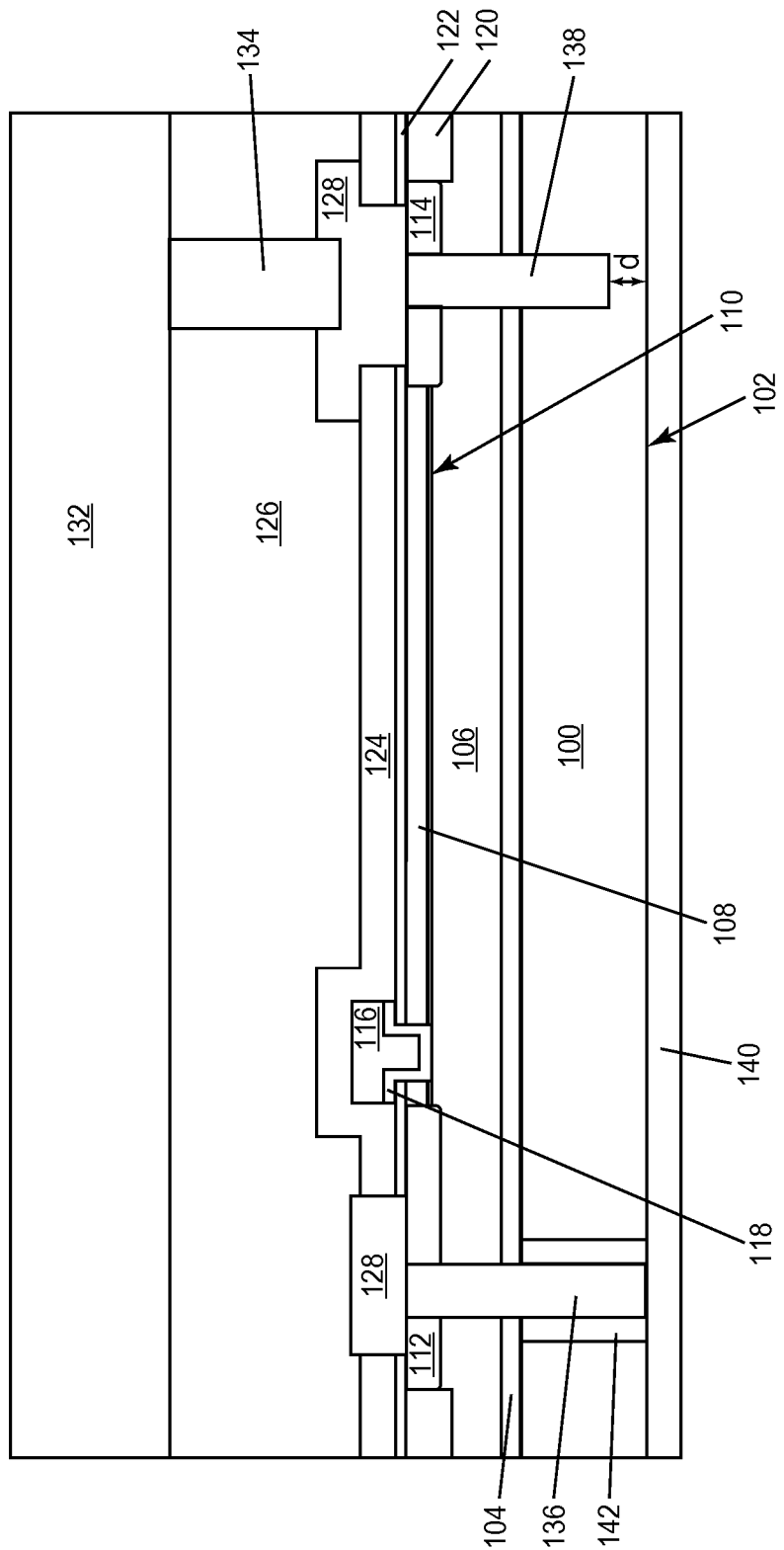
FIG. 1 illustrates a perspective cross-sectional view of an embodiment of a III-V semiconductor device having an integrated Schottky diode.

FIG. 1 illustrates an embodiment of a III-V semiconductor transistor device. According to this embodiment, the transistor device includes a semiconductor carrier 100 such as a Si, SiC or sapphire substrate with a metallized backside 102 i.e. the side 102 of the carrier 100 facing away from the active device area is metallized. A nucleation (seed) layer 104 such as an AlN layer is disposed on the front (device) side of the semiconductor carrier 100. A first compound semiconductor material, also referred to herein as a buffer region 106, is disposed on the nucleation layer 104. A second compound semiconductor material, also referred to herein as a barrier region 108, is disposed on the buffer region 106. The barrier region 108 comprises a different material than the buffer region 106 such that the buffer region 106 has a 2DEG (for an n-channel device) or a 2DHG (for a p-channel device) just below the interface between the buffer and barrier regions 106, 108. The 2DEG or 2DHG forms a lateral conductive channel 110 between source and drain regions 112, 114 of the device. The source and drain regions 112, 114 extend from the barrier region 108 into the buffer region 106 and are separated by the channel 110. The device may be normally-on or normally-off. For example, a gate 116 may be provided which is insulated from the barrier region 108 by a gate dielectric 118 and controls the channel 110 responsive to a voltage applied to the gate 116. Additional insulating materials may also be provided. For example, an isolation material 120 may be provided for electrically isolating laterally adjacent devices.

A nitride layer 122 can be formed on the barrier region 108. One or more inter-layer dielectrics 124, 126 may be provided, so that contacts 128 can be provided to the source, drain and gate regions 112, 114, 116 of the device and electrical connections can be made to the contacts 128 through an arrangement of wiring 132 and conductive vias 134. In one embodiment, the buffer region 106 of the device comprises GaN, the barrier region 108 comprises AlGaN and a 2DEG 110 forms in the buffer region 106 between n+GaN source and drain regions 112, 114. Other combinations of III-V semiconductor materials can be used in order to form a 2DEG or 2DHG 110 in the buffer region 106 of the device.

The transistor device further includes an integrated Schottky diode which includes a metallization 140 formed on the backside 102 of the semiconductor carrier 100, and contacts 136, 138 extending from the source and drain regions 112, 114, respectively, through the buffer region 106 and in electrical contact with the Schottky diode so that the Schottky diode is connected in parallel between the source and drain regions 112, 114 of the device. A lateral configuration of an HEMT, where current flows entirely along the channel 110 between the source and drain regions 112, 114, allows using the semiconductor carrier 100 to integrate the Schottky diode. The connection between the carrier/back side and the device/front side of a quasi-vertical HEMT, where current flows partly laterally along the channel 110 and partly vertically toward the carrier 100, can be done using a plug structure on the source and/or drain side. If both contacts 136, 138 are connected to the back side 102 of the carrier 100 as shown in FIG. 1, a parallel Schottky diode is implemented between the source and drain regions 112, 114. Such a body diode does not require any additional chip area. In some embodiments the Schottky diode has a forward voltage of 0.7 V or less e.g. 0.4 V or less.

On the source side, the contact 136 extending from the source region 112 to the carrier backside metallization 140 can be realized using a doped polysilicon plug and/or a metal plug. The drain side contact 138, which also can be realized using a doped polysilicon plug and/or a metal plug, uses the entire semiconductor carrier 100 as a Schottky contact which is in contact the backside metallization 140. The contacts 136, 138 extend from the source and drain regions 112, 114 through the compound semiconductor materials 106, 108 and in electrical contact with the Schottky diode according to this embodiment, so that the Schottky diode is connected in parallel between the source and drain regions 112, 114.

More particularly, the source contact 136 extends through the buffer region 106 and the semiconductor carrier 100 and contacts the metallization 140 on the backside 102 of the carrier 100. A dielectric material 142 can be provided for insulating the source contact 136 from the semiconductor carrier 100. The drain contact 138 extends from the drain region 144 into the semiconductor carrier 100 and is in ohmic contact with the carrier 100, but terminates prior to reaching the metallization 140. Accordingly, the metallization 140 is spaced apart from the drain contact 138 by a portion of the semiconductor carrier 100. The distance d between the bottom of the drain contact 138 and the metallization 140 on the backside 102 of the carrier 100 at least partly determines the breakdown voltage of the Schottky diode. The distance d is at least 0.5 μm for a GaN system, to accommodate a 30 V application. Other distances may be employed, depending on the semiconductor system in use and the target application. The configuration of the transistor device shown in FIG. 1 reduces the relevant resistance of such a device. Existing standard processes can be used to fabricate the transistor device, minimizing implementation risks.

Figure 2A:
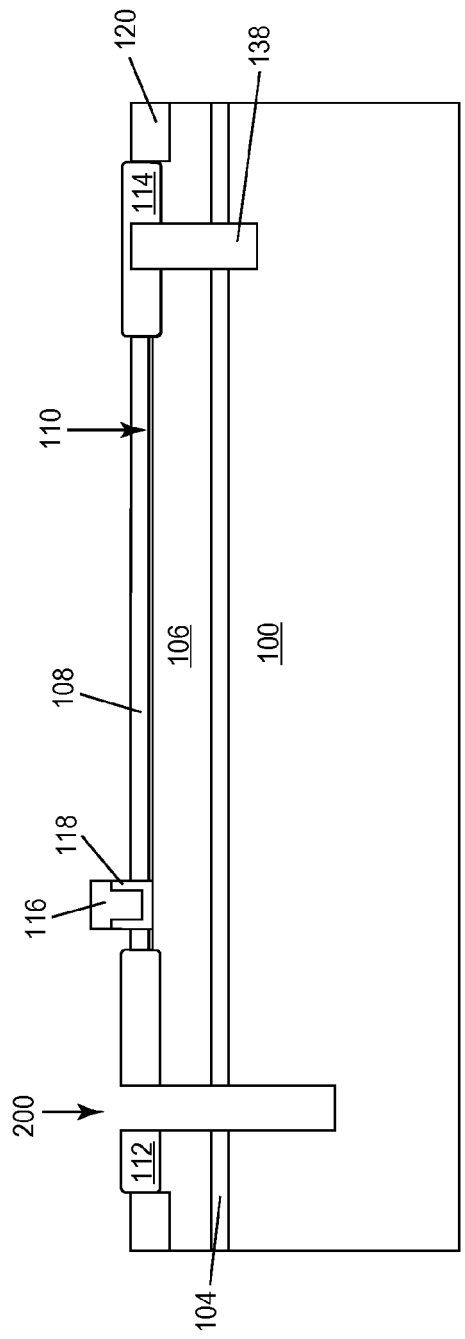
FIGS. 2A to 2E illustrate perspective cross-sectional views of an embodiment of a method of manufacturing the semiconductor device shown in FIG. 1.

FIGS. 2A-2E illustrate an embodiment of a method of manufacturing the transistor device illustrated in FIG. 1. FIG. 2A shows the transistor device after the nucleation, buffer and barrier regions 104, 106, 108 are formed on the semiconductor carrier 100, and after formation of the source, drain and gate regions 112, 114, 116. Standard processing steps can be performed to form these regions of the transistor device, and therefore no further explanation is provided. Next a trench 200 is etched which extends through the source region 112 and the buffer region 106 and into the semiconductor carrier 100. A similar trench is etched on the drain side, but not shown in FIGS. 2A-2E for ease of illustration because the process sequence for forming the drain-side trench is similar to that of the source-side trench 200. The source-side trench 200 can be etched using known bottle etching techniques so that the width of the trench 200 within the semiconductor carrier 100 is wider than in the buffer region 106 above the carrier 100.

Figure 2B:
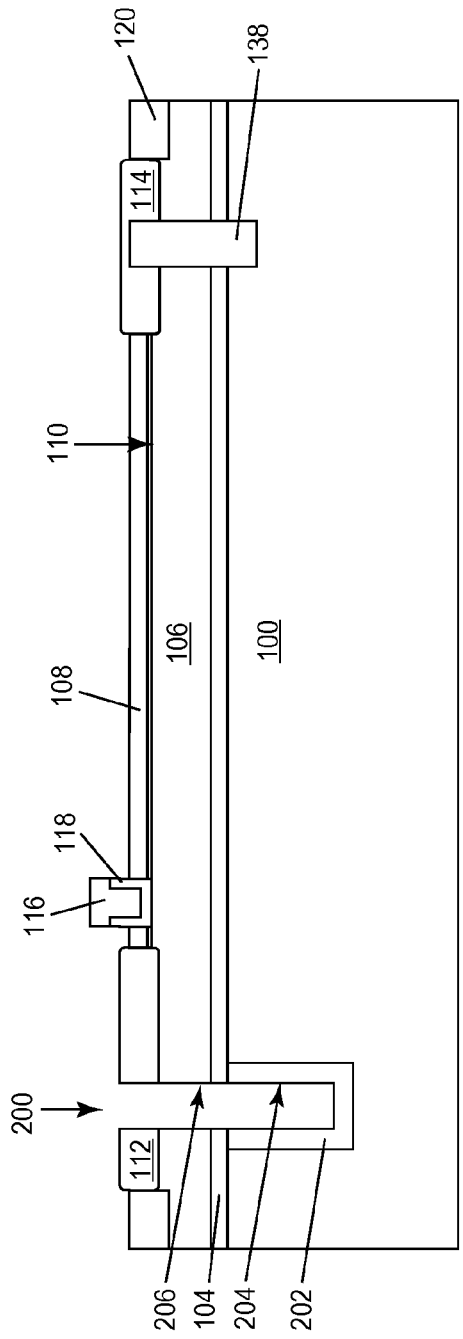

FIG. 2B shows the transistor device after an oxide 202 is grown on the sidewalls and bottom of the source-side trench 200 in the region of the carrier 100. The oxide growth can be adjusted in such a way that the oxide edge 204 is coincident with the edge 206 of the buffer region 106, avoiding steps in the subsequent filling process.

Figure 2C:
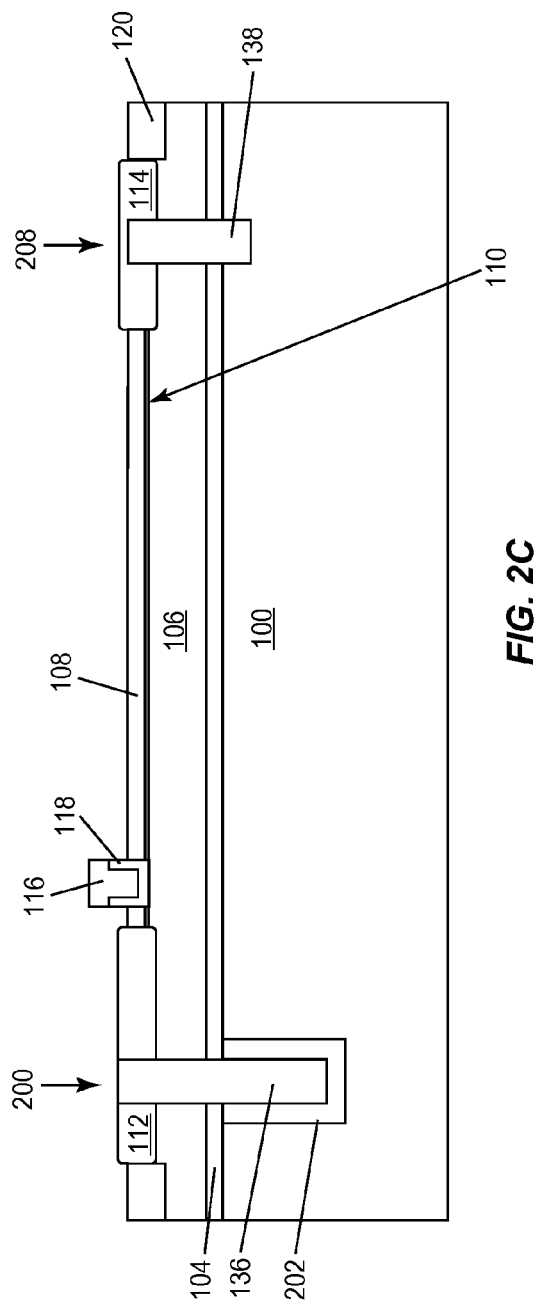

FIG. 2C shows the transistor device after the trenches 200, 208 are filled with a conductive material such as n+ doped polysilicon to form the respective source and drain contacts 136, 138. The conductive material in the source-side trench 200 is insulated from the semiconductor carrier 100 by the trench sidewall oxide 202, whereas the conductive material in the drain-side trench 208 is in ohmic contact with the semiconductor carrier 100.

Figure 2D:
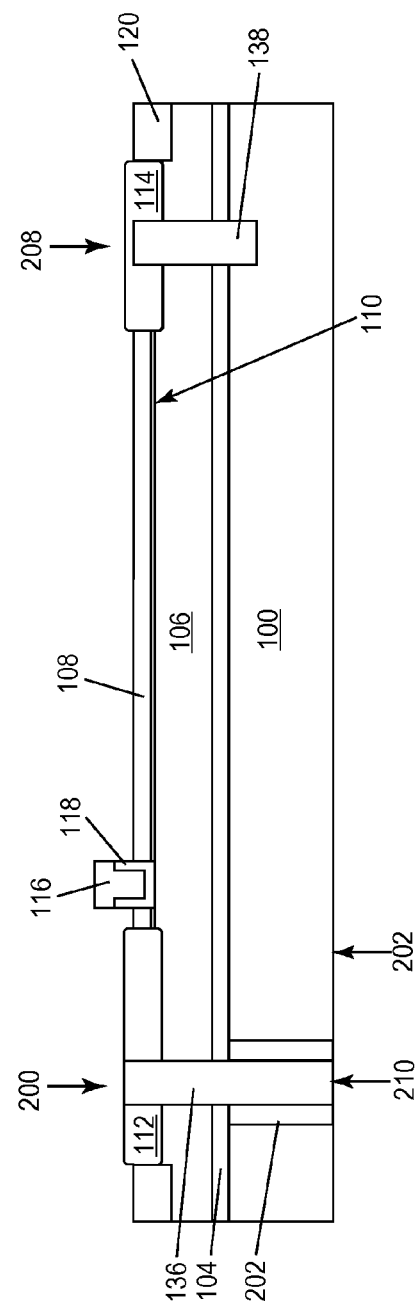

FIG. 2D shows the transistor device after the backside 102 of the semiconductor carrier 100 is thinned using a conventional thinning process such as CMP (chemical mechanical polishing). The etching process continues until the trench sidewall oxide 202 is removed at the bottom 210 of the source-side trench 200. Opening the bottom 210 of the source-side trench 200 enables a subsequent connection of the source contact 136 with the carrier backside metallization 140.

Figure 2E:
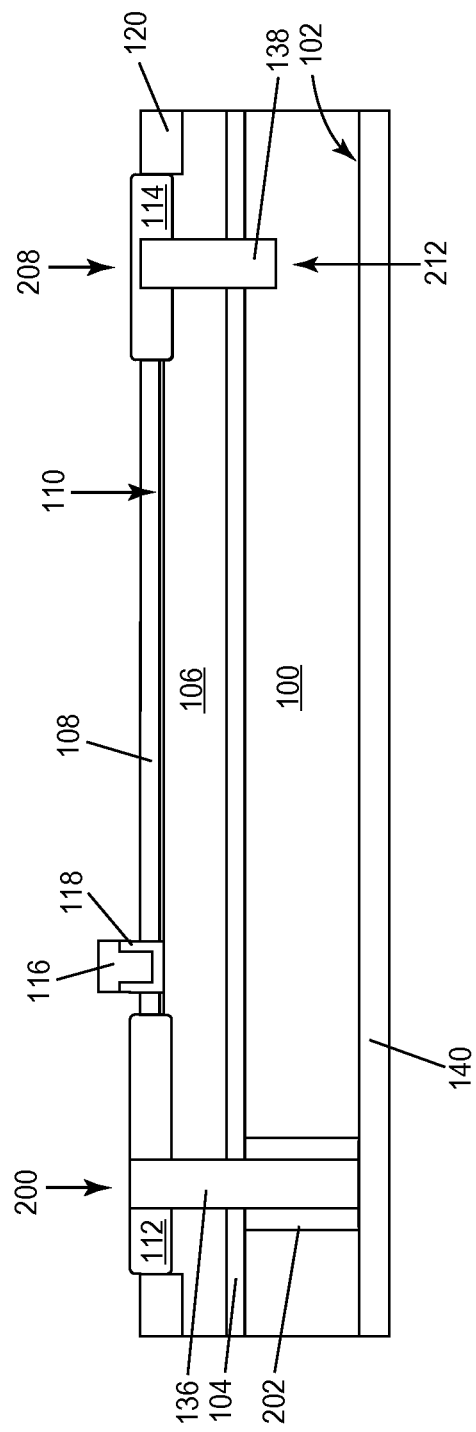

FIG. 2E shows the transistor device after the backside 102 of the carrier 100 is metallized. The backside metallization 140 contacts the source contact 136, and the drain contact 138 is spaced apart from the metallization 140 by a region of the carrier 100 because the source-side trench 200 extends deeper into the semiconductor carrier 100 than the drain-side trench 208 as explained above. As such, the electrically conductive material disposed in the drain-side trench 208 remains covered by the semiconductor carrier 100 at the bottom 212 of the drain-side trench 208. The integrated Schottky diode is formed by the backside metallization 140 being in close contact with the semiconductor carrier 100.

Further conventional processing can be performed to arrive at the HEMT structure shown in FIG. 1, which has a connection from the source region 112 through the carrier 100 to the metallized carrier backside 102 in combination with an integrated Schottky body diode between the source and drain regions 112, 114. The source contact 136 is isolated from the semiconductor carrier 100 by a trench side wall dielectric 202 according to this embodiment, and the entire carrier backside 102 is covered by a metallization 140 to assure good back side contact. The drain contact 138 is also realized using a trench 208. The drain trench 208 is filled with e.g. n+ polysilicon and does not physically contact the backside metallization 140. The distance d between the drain trench bottom 212 and the backside metallization 140 is chosen in such a way, that the Schottky contact, realized between the interface of the backside metallization 140 and the low doped (e.g. n−) semiconductor carrier 100, is sufficient to provide the needed voltage class robustness as previously explained herein. With this process sequence a low ohmic body Schottky diode can be integrated in a GaN/AlGaN or other type of HEMT structure.

Figure 3:
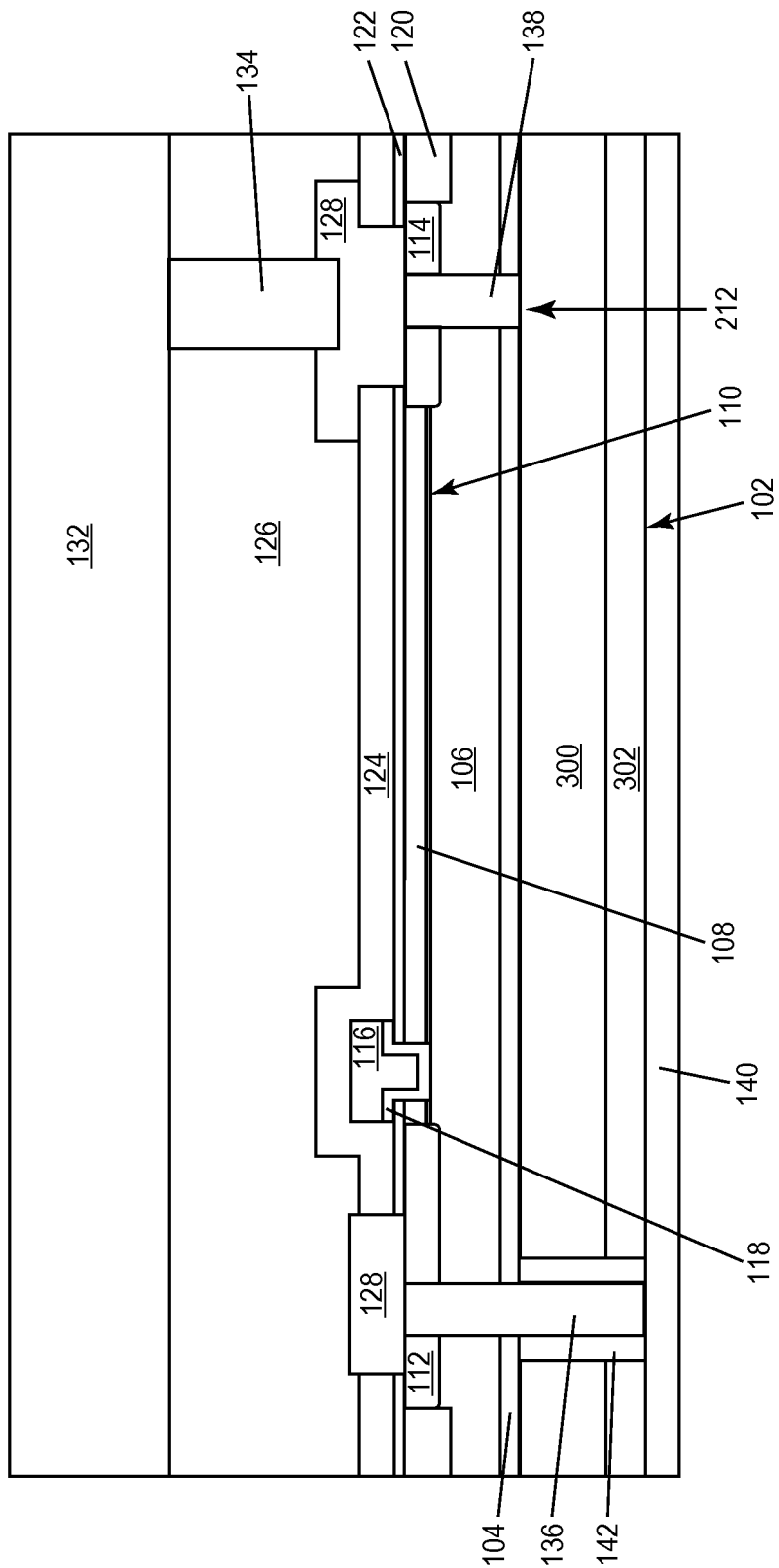
FIG. 3 illustrates a perspective cross-sectional view of another embodiment of a III-V semiconductor device having an integrated Schottky diode.

FIG. 3 illustrates another embodiment of a III-V semiconductor transistor device. The embodiment shown in FIG. 3 is similar to the embodiment shown in FIG. 1, however the drain-side trench does not extend into the semiconductor carrier 100. To realize a low ohmic Schottky diode according to this embodiment, a highly doped e.g. n-type silicon substrate 300 is provided. The bottom part 302 of the silicon substrate 300 is slightly doped e.g. n-type in this example to realize a proper Schottky contact on the carrier backside 102. The low doped region 302 of the substrate 300 can be obtained e.g. by counter doping. In each case, the less highly doped semiconductor region 302 is in contact with the backside metallization 140 and the more highly doped semiconductor region 300 is interposed between the less highly doped semiconductor region 302 and the buffer region 106 of the transistor device. The source contact 136 extends through both regions of the semiconductor carrier 300, 302 and contacts the backside metallization 140. The drain contact 138 extends to the more highly doped semiconductor region 300 and terminates prior to reaching the less highly doped semiconductor region 302. This way, the bottom 212 of the drain contact 138 is spaced apart from the backside metallization 140 by at least part of the more highly doped semiconductor region 300 and also by the less highly doped semiconductor region 302. The Schottky contact is realized between the interface of the backside metallization 140 and the less highly doped semiconductor region 302.

Figure 4:
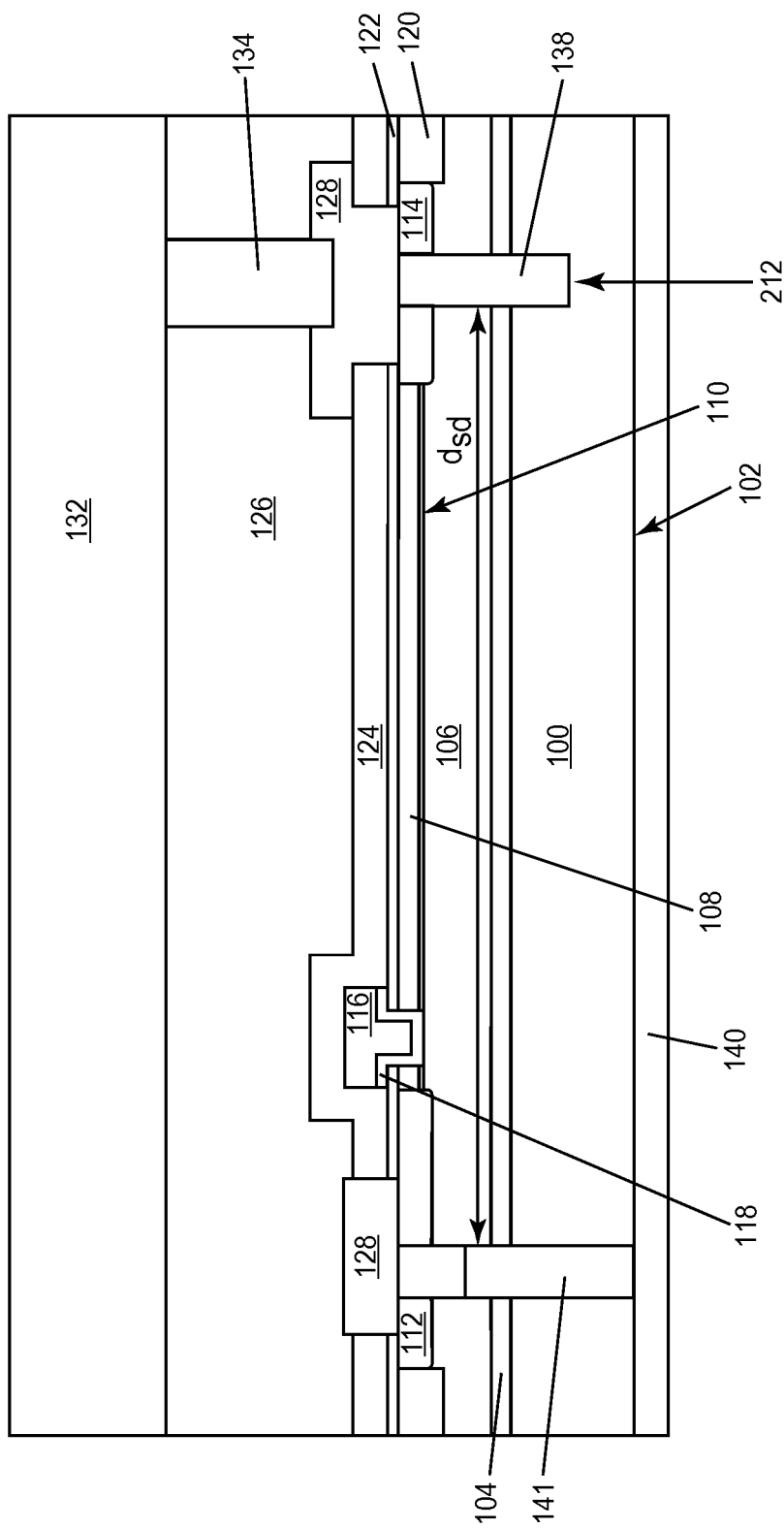
FIG. 4 illustrates a perspective cross-sectional view of yet another embodiment of a III-V semiconductor device having an integrated Schottky diode.

FIG. 4 illustrates yet another embodiment of a III-V semiconductor transistor device. The embodiment shown in FIG. 4 is similar to the embodiment shown in FIG. 1, however the source contact 136 does not extend to the semiconductor carrier 100. Instead, the metallization 140 on the carrier backside 102 extends through at least part of the semiconductor carrier 100 to the source contact 136. The vertical part 141 of the backside metallization 140 i.e. the part which extends generally perpendicular to the carrier backside 102 to the source contact 136, is not electrically insulated from the carrier 100. With this configuration, a Schottky contact is formed at the wafer backside 102 and also along sidewalls of the source-side trench in which the backside metallization 140 vertically extends. Also with this configuration, the lateral distance $d_{sd}$ between the source and drain regions 112, 114 of the device is large enough to provide the desired blocking voltage. Additionally, also the vertical distance between the drain bottom 212 to the carrier backside 102 must be sufficient to sustain the desired blocking voltage. This embodiment further provides a very low ohmic body Schottky diode integration within a GaN/AlGaN HEMT or other type of HEMT.

Figure 5:
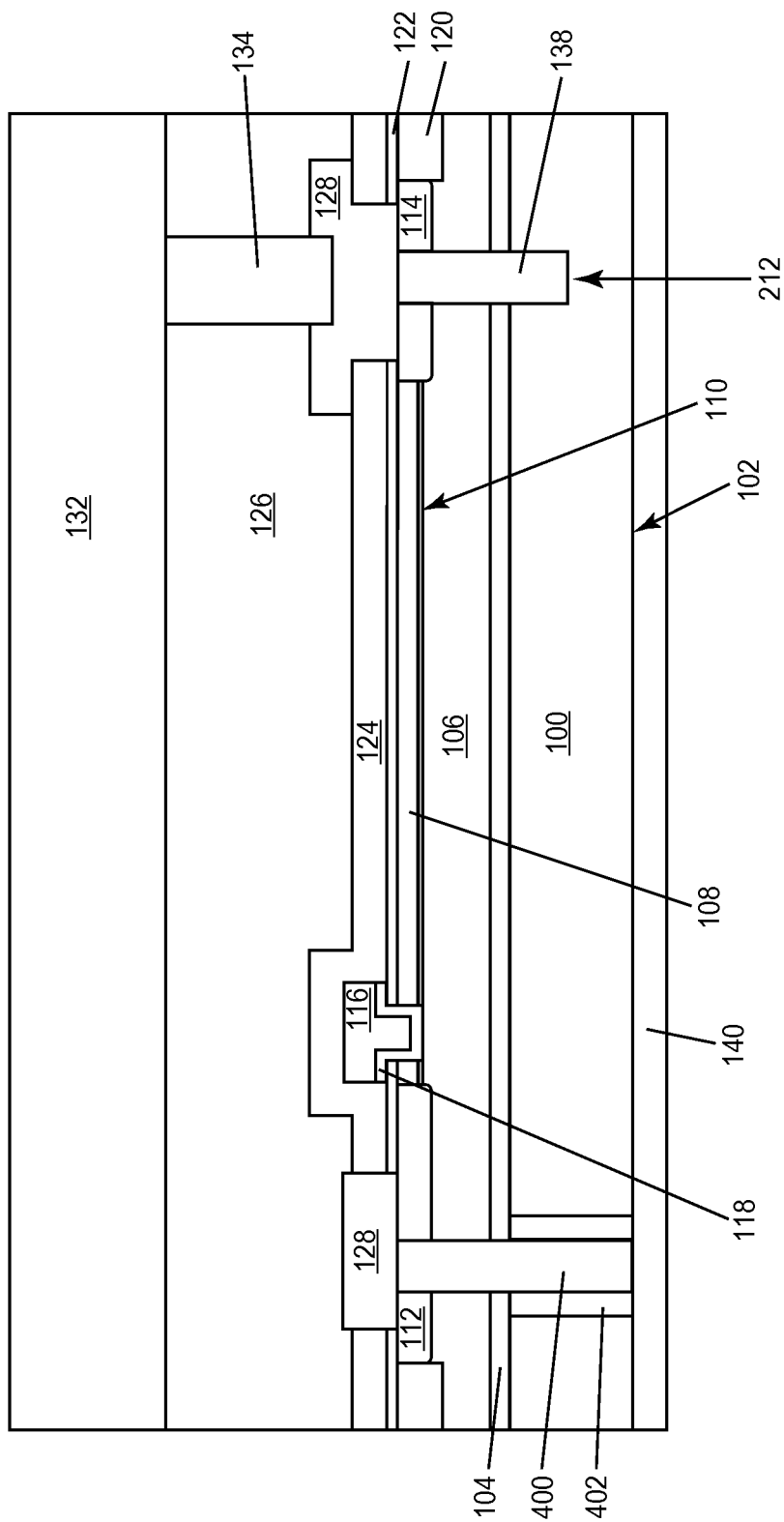
FIG. 5 illustrates a perspective cross-sectional view of still another embodiment of a III-V semiconductor device having an integrated Schottky diode.

FIG. 5 illustrates still another embodiment of a III-V semiconductor transistor device. The embodiment shown in FIG. 5 is similar to the embodiment shown in FIG. 1, however a metal plug 400 is used to fill the bottom of the source-side trench instead of polysilicon. The upper part of the source-side trench is filled with doped polysilicon. The sidewalls of the source-side trench have an insulation layer 402 in the region of the semiconductor carrier 100 according to this embodiment, to insulate the metal plug 400 from the carrier 100. The drain-side trench is filled with doped polysilicon to form the drain contact 138, with the drain-side trench bottom 212 ending above the backside metallization 140 as previously described herein.

Figure 6:
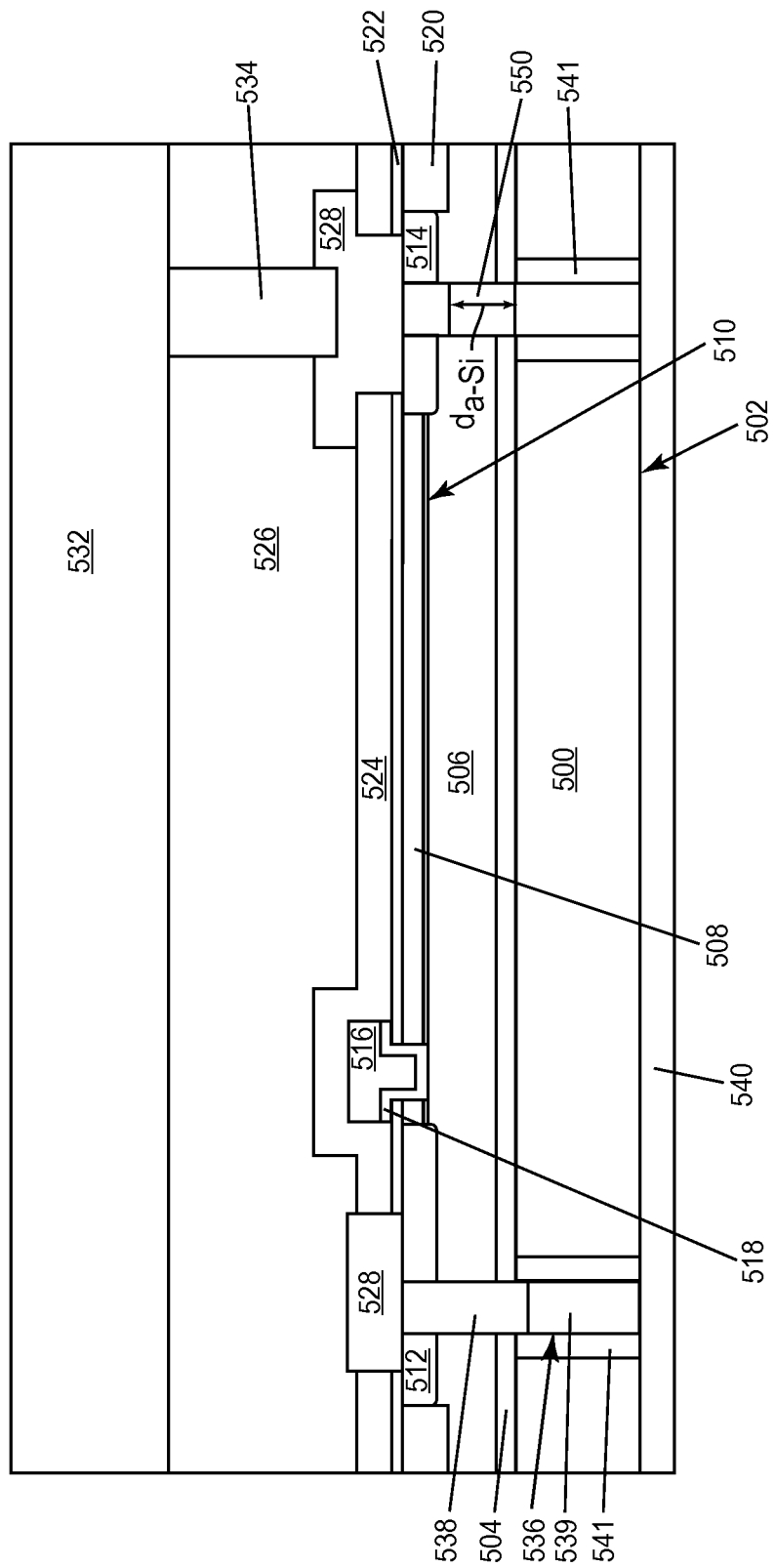
FIG. 6 illustrates a perspective cross-sectional view of an embodiment of a III-V semiconductor device having an integrated Schottky diode formed by a region of doped amorphous silicon or doped polycrystalline silicon disposed in a trench structure of the device.

FIG. 6 illustrates an embodiment of a III-V semiconductor transistor device having an integrated Schottky diode formed by a region of doped amorphous silicon or doped polycrystalline silicon 550 disposed in a trench structure of the device. The transistor device includes a carrier 500 such as a Si, SiC or sapphire substrate or a dielectric material with a metallized backside 502 i.e. the side of the carrier 500 facing away from the active device area is metallized. The transistor device further includes a nucleation (seed) layer 504 such as an AlN layer is disposed on the carrier 500, a buffer region 506 disposed on the nucleation layer 504 and a barrier region 508 disposed on the buffer region 506. The barrier region 508 comprises a different material than the buffer region 506 as previously explained herein. The device has a 2DEG or 2DHG depending on the type of semiconductor materials used for the buffer and barrier regions 506, 508, which forms a lateral conductive channel 510 between source and drain regions 512, 514 of the device. The source and drain regions 512, 514 extend from the barrier region 508 into the buffer region 506 and are separated by the channel 510. A gate 516 is provided for controlling the channel 510 and is insulated from the barrier region 508 by a gate dielectric 518. Additional insulating materials may also be provided. For example, an isolation material 520 may be provided for electrically isolating laterally adjacent devices. A nitride layer 522 can be formed on the barrier region 508. One or more inter-layer dielectrics 524, 526 may be provided, so that contacts 528 can be provided to the source, drain and gate regions 512, 514, 516 of the device and electrical connections can be made to the contacts 528 through an arrangement of wiring 532 and conductive vias 534. In one embodiment, the buffer region 506 of the device comprises GaN, the barrier region 508 comprises AlGaN and a 2DEG 510 forms in the buffer region 506. Other combinations of III-V semiconductor materials can be used in order to form a 2DEG or 2DHG 510 in the buffer region 506 of the device.

A trench formed through the drain region 514 and into the buffer region 506 is filled with doped amorphous silicon or doped polycrystalline silicon 550. The doped amorphous silicon or doped polycrystalline silicon 550 is in contact with the drain region 514 and extends through at least part of the buffer region 506. Metallization 540 on the backside 502 of the carrier 500 extends to the doped amorphous silicon or doped polycrystalline silicon region 550 to form a Schottky diode. A source contact 536 extends from the source region 512 through at least part of the buffer region 506 and in electrical contact with the carrier backside metallization 540 so that the Schottky diode is connected in parallel between the source and drain regions 512, 514. The source contact 536 includes an upper polysilicon plug 538 and a lower metal plug 539 according to this embodiment. The metal plug may or may not be electrically insulated from the carrier 500 by a dielectric material 541 as previously described herein. Any of the source contact embodiments previously described herein may be employed for contacting the backside metallization 540. For example, the carrier backside metallization 540 can extend through the carrier 500 to both the source contact 536 and to the doped amorphous silicon or doped polycrystalline silicon region 550. In one embodiment, the doped amorphous silicon or doped polycrystalline silicon region 550 extends to a depth $d_{a-si}$ (thickness) of at least 2 μm in a direction toward the backside metallization 540. In general the depth (thickness) of the doped amorphous silicon or doped polycrystalline silicon region 550 at least in part determines the blocking voltage capability of the transistor device. At a depth (thickness) of about 2 μm for an AlGaN/GaN system, the doped amorphous silicon or doped polycrystalline silicon region 550 can support a 30V application. In one embodiment, the Schottky diode formed by the metallization 540 in contact with the doped amorphous silicon or doped polycrystalline silicon region 550 has a forward voltage of 0.7V or less.

Figure 7I:
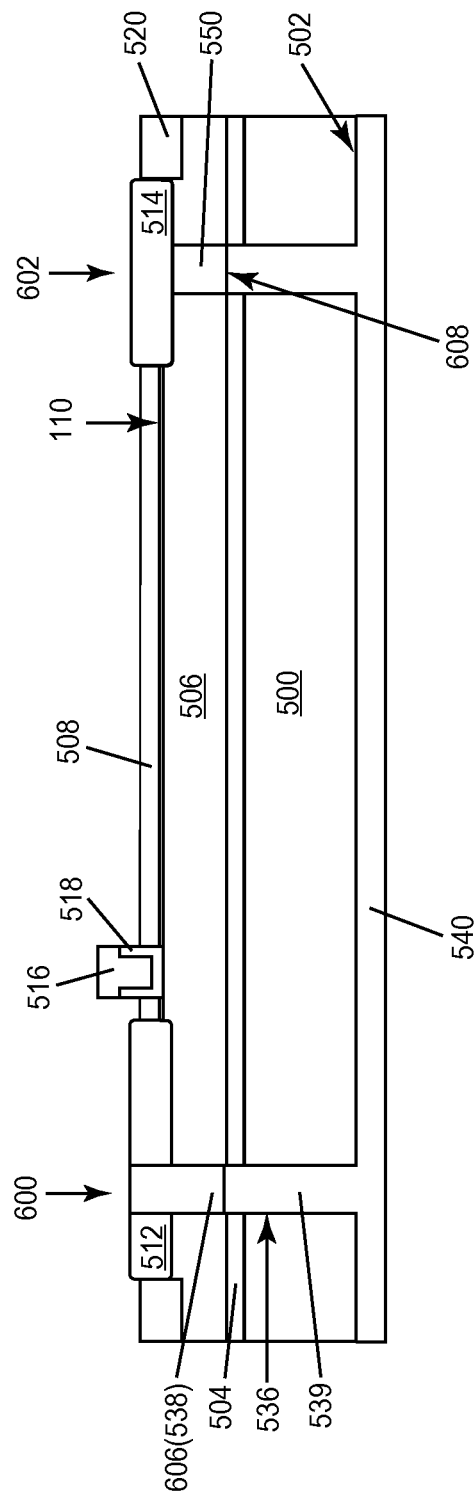

FIGS. 7A-7I illustrate an embodiment of a method of manufacturing the transistor device illustrated in FIG. 6. FIG. 7A shows the transistor device after the nucleation, buffer and barrier regions 504, 506, 508 are formed on a Si substrate 500, and after formation of the source, drain and gate regions 512, 514, 516. Standard processing steps can be performed to form these regions of the transistor device, and therefore no further explanation is provided. FIG. 7A also shows the device after source and drain contact trenches 600, 602 are etched simultaneously.

FIG. 7B shows the transistor device after the trenches 600, 602 are filled with a sacrificial oxide 604.

FIG. 7C shows an oxide recess step performed in such a way that the upper part of each trench 600, 602 is opened without the recess etch penetrating into the Si substrate 500.

FIG. 7D shows the transistor device after the upper (opened) part of the trenches 600, 602 is filled with a highly doped (e.g. n+) polysilicon 606. The doped polysilicon 606 in the source-side trench 600 forms the polysilicon plug 538 part of the source contact 536 which connects to the Schottky diode. The doped polysilicon 606 in the drain-side trench 602 is sacrificial and will be subsequently removed.

FIG. 7E shows the transistor device after the highly doped polysilicon 606 is removed from the drain-side trench 602 e.g. by standard masking and etching techniques. This step once again opens the upper part of the drain-side trench 602.

FIG. 7F shows the transistor device after the upper (opened) part of the drain-side trench 602 is filled with a low doped (e.g. n or n−) amorphous or doped polycrystalline silicon 550. This low doped amorphous silicon region 550 will form a Schottky diode with a metallization region in later processing steps. The depth of the amorphous silicon plug 550 is chosen in such a way that the breakdown voltage of the Schottky diode is sufficient to meet the voltage class requirements of the device e.g. a 2 μm depth corresponds to a breakdown voltage of about 50V at a doping level of about 1e16 atoms/cm$^3$. In case of using an amorphous silicon process sequence, the subsequent temperature budget should not exceed about 550° C. to avoid recrystallization of the amorphous silicon region 550 (recrystallization results in a not well controlled breakdown behavior of the Schottky diode). For lower voltage classes polycrystalline silicon can be used, because the not well controlled breakdown behavior is not crucial so long as the breakdown voltage is above the desired voltage class.

FIG. 7G shows the transistor device after the backside 502 of the Si substrate 500 is thinned e.g. via CMP. Optionally, all of the Si substrate 500 can be removed if desired or only a portion as shown in FIG. 7G.

FIG. 7H shows the transistor device after the sacrificial oxide 604 is removed from the source-side and drain-side trenches 600, 602. The bottom part of the trenches 600, 602 is opened after this step.

FIG. 7I shows the transistor device after a metallization 540 is deposited on the backside 502 of the thinned Si substrate 500. In the case where the Si substrate 500 is completely removed, the backside metallization 540 can be formed on a dielectric layer disposed on the nucleation (seed) layer 504. In either case, the metallization 540 connects to the source contact 536 disposed in the source-side trench 600 and to the doped amorphous silicon region 550 disposed in the drain-side trench 602. That is, the metallization 540 fills the lower part of the drain-side trench 602 and the doped amorphous silicon 550 in the upper part of the drain-side trench 602 contacts the metallization 540 so that there is a direct interface 608 between the two materials 540, 550. The metallization 540 also fills the lower part of the source-side trench 600 to form a metallized plug 539. The doped polysilicon plug 538 disposed in the upper part of the source-side trench 600 contacts the metallized plug 539 to form the source contact 536. By forming a lowly doped amorphous silicon region 550 in the upper part of the drain-side trench 602, a suitable Schottky contact is formed between the backside metallization 540 and the doped amorphous silicon region 550 on the drain side of the device. Further conventional processing can be performed to arrive at the HEMT structure shown in FIG. 6.

Figure 8:
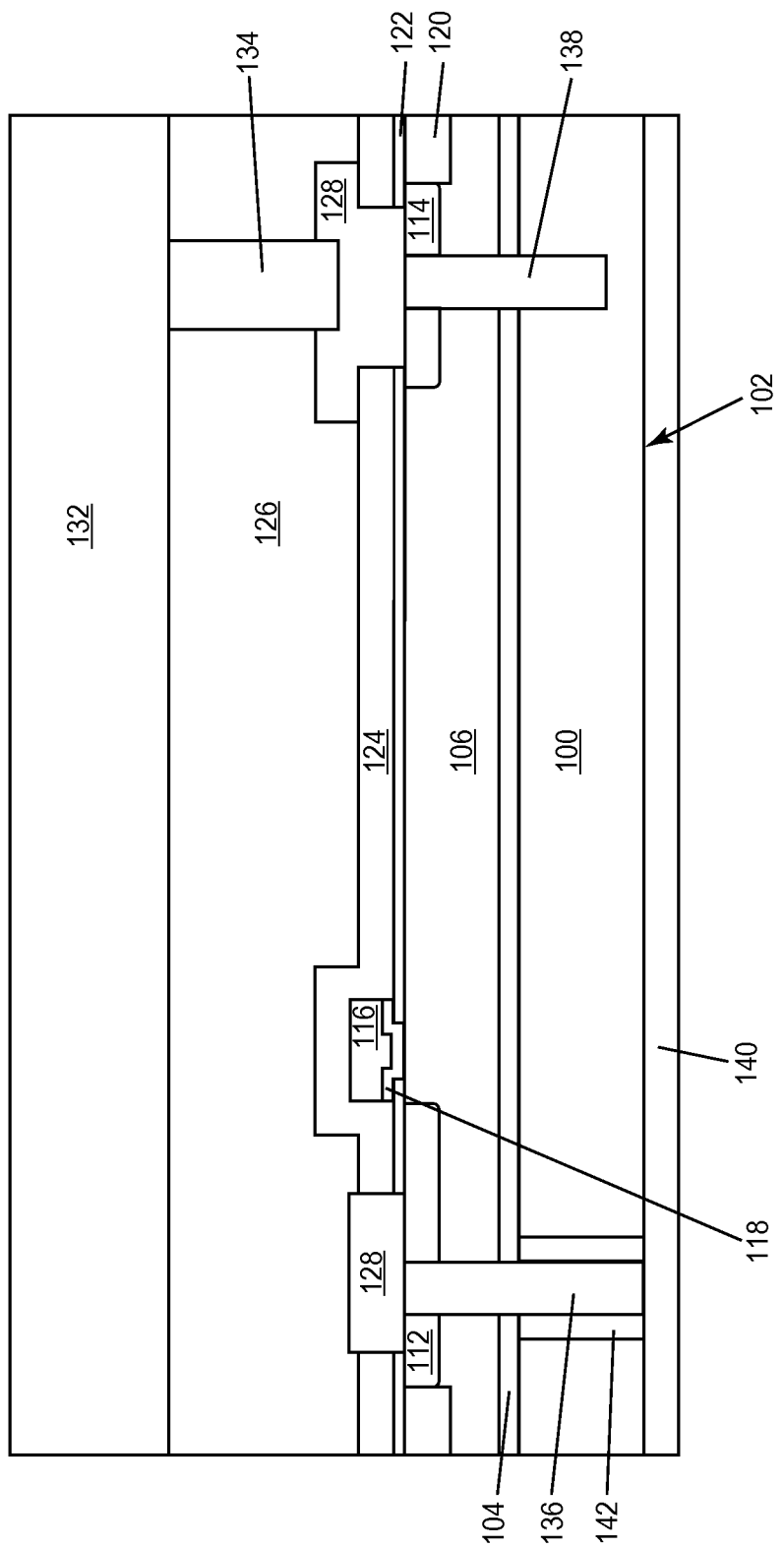
FIG. 8 illustrates a perspective cross-sectional view of an embodiment of a bulk III-V semiconductor device having an integrated Schottky diode.

FIG. 8 illustrates an embodiment of a III-V semiconductor transistor device similar to the embodiment shown in FIG. 1, however no barrier region is provided and therefore no 2DEG or 2DHG forms in the buffer region 106. According to this embodiment, the device is a bulk GaN transistor. The channel of the bulk GaN transistor is formed between the source and drain regions 112, 114, at the surface of the GaN buffer region 106 directly beneath the gate oxide 118. As with the other embodiments described herein, the channel is controlled by applying a suitable voltage to the gate electrode 116. However no 2DEG or 2DHG arises between the source 112 and the channel, or between the channel and the drain 114. The Schottky diode trench embodiments previously described herein e.g. with reference to FIGS. 6 and 7 similarly can be adapted for bulk GaN transistors by omitting the barrier region so that no 2DEG or 2DHG is present in the buffer region 106.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a compound semiconductor material on a semiconductor carrier;
a source region and a drain region spaced apart from each other in the compound semiconductor material with a channel region interposed between the source and drain regions;
a Schottky diode integrated with the semiconductor carrier and connected in parallel between the source and drain regions;
a layer of metallization on a side of the semiconductor carrier facing away from the compound semiconductor material; and
wherein the Schottky diode comprises contacts extending from the source and drain regions through the compound semiconductor material, wherein a first one of the contacts directly contacts the layer of metallization and a second one of the contacts terminates so that the metallization is spaced apart from the second contact by a portion of the semiconductor carrier, wherein the portion of the semiconductor carrier that separates the second contact from the layer of metallization has a single doping type, and wherein the second contact is in ohmic contact with the semiconductor carrier.

2. A transistor device according to claim 1, further comprising a dielectric material insulating the first contact from the semiconductor carrier.

3. A transistor device according to claim 1, wherein the contacts comprise doped polysilicon.

4. A transistor device according to claim 1, wherein the first contact extends from the source region, through the semiconductor carrier and contacts the metallization, and wherein the second contact extends from the drain region into the semiconductor carrier and terminates prior to reaching the metallization so that the metallization is spaced apart from the second contact by a portion of the semiconductor carrier.

5. A transistor device according to claim 1, wherein the semiconductor carrier comprises a less highly doped semiconductor region in contact with the metallization and a more highly doped semiconductor region interposed between the less highly doped semiconductor region and the compound semiconductor material, the first contact extends through the semiconductor carrier and contacts the metallization, and the second contact extends to the more highly doped semiconductor region and terminates prior to reaching the less highly doped semiconductor region.

6. A transistor device according to claim 1, wherein the metallization extends through at least part of the semiconductor carrier to the first contact.

7. A transistor device according to claim 1, wherein the second contact is separated from the metallization by at least a 0.5 μm thick region of the semiconductor carrier.

8. A transistor device according to claim 1, wherein the compound semiconductor material comprises GaN and the channel region comprises a two dimensional electron gas formed in the GaN.

9. A transistor device according to claim 1, wherein the semiconductor carrier comprises Si, SiC or sapphire.

10. A transistor device according to claim 1, wherein the Schottky diode has a forward voltage of 0.7V or less.

11. A transistor device, comprising:
a compound semiconductor material on a carrier;
a source region and a drain region spaced apart from each other in the compound semiconductor material with a channel region interposed between the source and drain regions;
a doped amorphous silicon or doped polycrystalline silicon region in contact with the drain region and extending through at least part of the compound semiconductor material;

a metallization on a side of the carrier facing away from the compound semiconductor material, the metallization extending to the doped amorphous silicon or doped polycrystalline silicon region to form a Schottky diode; and a source contact extending from the source region through at least part of the compound semiconductor material and in electrical contact with the metallization so that the Schottky diode is connected in parallel between the source and drain regions;

wherein the metallization on the side of the carrier facing away from the compound semiconductor electrically connects the source contact to the Schottky diode, and wherein the metallization extends through the carrier to the source contact.

12. A transistor device according to claim 11, wherein the doped amorphous silicon or doped polycrystalline silicon region extends to a depth of at least 2 μm in a direction toward the metallization.

13. A transistor device according to claim 11, wherein the compound semiconductor material comprises GaN and the channel region comprises a two dimensional electron gas formed in the GaN.

14. A transistor device according to claim 11, wherein the carrier comprises Si, SiC, sapphire or a dielectric material.

15. A transistor device according to claim 11, wherein the Schottky diode has a forward voltage of 0.7V or less.

16. A transistor device, comprising:
a compound semiconductor material on a semiconductor carrier;
a source region and a drain region spaced apart from each other in the compound semiconductor material with a channel region interposed between the source and drain regions;
a Schottky diode integrated with the semiconductor carrier and connected in parallel between the source and drain regions;
a layer of metallization on a side of the semiconductor carrier facing away from the compound semiconductor material; and
wherein the Schottky diode comprises contacts extending from the source and drain regions through the compound semiconductor material, wherein a first one of the contacts directly contacts the layer of metallization and a second one of the contacts terminates so that the metallization is spaced apart from the second contact by a portion of the semiconductor carrier, wherein the portion of the semiconductor carrier that separates the second contact from the layer of metallization has a single doping type,
wherein the semiconductor carrier comprises a less highly doped semiconductor region in contact with the metallization and a more highly doped semiconductor region interposed between the less highly doped semiconductor region and the compound semiconductor material and the second contact extends to the more highly doped semiconductor region and terminates prior to reaching the less highly doped semiconductor region.

* * * * *

UNITED STATES PATENT AND TRADEMARK OFFICE
CERTIFICATE OF CORRECTION

| | | |
|---|---|---|
| PATENT NO. | : 8,872,235 B2 | Page 1 of 1 |
| APPLICATION NO. | : 13/403606 | |
| DATED | : October 28, 2014 | |
| INVENTOR(S) | : G. Prechtl et al. | |

It is certified that error appears in the above-identified patent and that said Letters Patent is hereby corrected as shown below:

On Title Page item (75), Inventors, "Rosenal" should be -- Rosental --.

Signed and Sealed this
Twenty-fourth Day of March, 2015

Michelle K. Lee
*Director of the United States Patent and Trademark Office*